United States Patent [19]
Nishida

[11] Patent Number: 5,584,941
[45] Date of Patent: Dec. 17, 1996

[54] SOLAR CELL AND PRODUCTION PROCESS THEREFOR

[75] Inventor: Shoji Nishida, Fujisawa, Japan

[73] Assignee: Canon Kabushiki Kaisha, Tokyo, Japan

[21] Appl. No.: 406,157

[22] Filed: Mar. 17, 1995

[30] Foreign Application Priority Data

Mar. 22, 1994 [JP] Japan .................. 6-050846

[51] Int. Cl.$^6$ .................. H01L 31/0392; H01L 31/0368; H01L 31/06; H01L 31/18
[52] U.S. Cl. .................. 136/258; 257/51; 257/64; 257/75; 437/4; 437/109; 437/173; 437/174; 437/233; 437/967
[58] Field of Search .................. 136/258 PC; 257/51, 257/64, 75; 437/4, 109, 173–174, 233, 967

[56] References Cited

U.S. PATENT DOCUMENTS

| | | | |
|---|---|---|---|
| 4,539,431 | 9/1985 | Moddel et al. | 136/258 |
| 4,571,448 | 2/1986 | Barnett | 136/259 |
| 5,397,713 | 3/1995 | Hamamoto et al. | 437/4 |

OTHER PUBLICATIONS

Extended Abstracts for Academic Lecture 18a–SK–11, p. 672 (The 53 Autumn Meeting, 1992); The Japan Society of Applied Physics by Morikawa, Matsuno, Itagaki, Sasaki, and Kumabe.

*Primary Examiner*—Aaron Weisstuch
*Attorney, Agent, or Firm*—Fitzpatrick, Cella, Harper & Scinto

[57] ABSTRACT

In order to provide a low cost solar cell which has a high quality, little stressed polycrystalline silicon semiconductor layer of large crystal sizes on a low cost metal substrate and to provide a production process therefor, the solar cell has a metal layer, a metal oxide layer, and a polycrystalline silicon semiconductor layer formed in this order on the substrate, and the production process therefor comprises a step of depositing the metal layer on the substrate, a step of depositing the metal oxide layer on the metal layer, a step of depositing the semiconductor layer on the metal oxide layer, a step of depositing a cap layer on the surface of the semiconductor layer and fusing and solidifying the semiconductor layer by radiant heating from above the cap layer to form the polycrystalline semiconductor layer, and a step of removing the cap layer.

49 Claims, 5 Drawing Sheets

LIGHT IRRADIATION

SOLAR CELL AND PRODUCTION PROCESS THEREFOR

BACKGROUND OF THE INVENTION

1. Field of the Invention

The present invention relates to a solar cell and a production process therefor, and more particularly to a solar cell with good energy conversion efficiency and a production process therefor.

2. Related Background Art

In recent years solar cells which convert solar radiation or illumination light into electric energy have been utilized as an energy source in various devices.

Generally, the solar cells have a pn junction or pin junction in a functional part constructed of a semiconductor, and silicon is commonly used as the semiconductor for forming the pn junction (or pin junction). The use of single-crystal silicon is preferred from the aspect of efficiency of converging optical energy into electromotive force, but amorphous silicon is advantageous from the aspects of area increase and cost reduction.

In recent years, the use of polycrystalline silicon has been studied for the purpose of achieving cost as low as amorphous silicon and energy conversion efficiency as high as single-crystal silicon. It was, however, difficult for the conventionally suggested production processes to realize a thickness of polycrystalline silicon below 0.3 mm, because wafers obtained by slicing bulk polycrystalline silicon were used. Thus, the thickness of a semiconductor region was more than necessary for sufficiently absorbing the light, i.e. they were not thin enough with respect to effective use of material. Further, there is a desire to decrease the thickness so as to decrease the cost as well.

Therefore, attempts have been made to form a thin film of polycrystalline silicon, using thin-film technology such as the chemical vapor deposition process (CVD), but at present the crystal size is at most only a few hundredths of a micron, and the energy conversion efficiency is lower than with the wafers sliced from bulk polycrystalline silicon.

Another attempt was made to increase the crystal size by irradiating a polycrystalline silicon thin film with laser light to effect fusion and recrystallization thereof, but the degree of cost reduction is not yet enough and stable fabrication is difficult.

In addition, there is a proposal of a method for forming a crystalline silicon film in a thickness necessary and sufficient to absorb the solar radiation, on a low-cost substrate by radiant heating [Morikawa, Matsuno, Itagaki, Sasaki, and Kumabe; Extended Abstracts for Academic Lecture 18a-SK-11, p. 672 (The 53rd Autumn Meeting, 1992); The Japan Society of Applied Physics].

The above-described method, however, employed metallurgical-grade silicon as a substrate and the size of the substrate was as large as a silicon wafer, thus continuous growth of a large-area silicon layer thereon was not possible.

It is also conceivable to use a metal such as SUS (stainless steel) as a low-cost substrate for growing a large-area silicon layer thereon; this method, however, includes a problem of mixture of unnecessary impurity components into the silicon film and a problem that a polycrystalline silicon film cannot be formed directly on the stainless steel substrate because of a difference of thermal expansion coefficients between them.

SUMMARY OF THE INVENTION

It is, therefore, an object of the present invention to provide a solar cell having a polycrystalline silicon layer with large crystal size and excellent characteristics and to provide a production process therefor, solving the above problems.

In other words, the object of the present invention is to provide a low cost solar cell by growing a polycrystalline semiconductor layer of large crystal size on a low-cost metal substrate.

It is another object of the present invention to achieve a high-quality polycrystalline silicon layer with less internal stress and to provide a solar cell by means of simple fabrication steps.

It is a further object of the present invention to provide a thin polycrystalline solar cell with excellent characteristics and a production process therefor.

It is another object of the present invention to provide a thin-film polycrystalline silicon solar cell in which a metal layer, a metal oxide layer, and a polycrystalline semiconductor layer are formed in order on a substrate.

It is a still further object of the present invention to provide a process for producing a thin-film polycrystalline silicon solar cell, which comprises:

(i) a step of depositing a metal layer on a substrate;

(ii) a step of depositing a metal oxide layer on the metal layer;

(iii) a step of depositing a semiconductor layer on the metal oxide layer;

(iv) a step of depositing a cap layer on a surface of the semiconductor layer and fusing and solidifying the semiconductor layer by lamp heating applied from above the cap layer, thereby forming a polycrystalline semiconductor layer; and (v) a step of removing the cap layer.

DESCRIPTION OF THE PREFERRED SPECIFIC EXAMPLES

The following describes experiments conducted in order to achieve the present invention, whereby the constitution and operation of the present invention will be described.

Figure 1A:
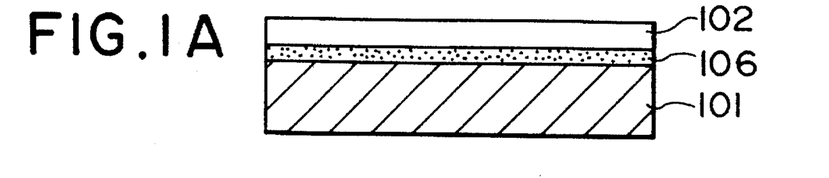
FIG. 1A to FIG. 1D are diagrammatic cross sections which illustrate a preferred example of major steps in the process for producing a thin-film polycrystalline silicon solar cell according to the present invention.
Figure 1B:
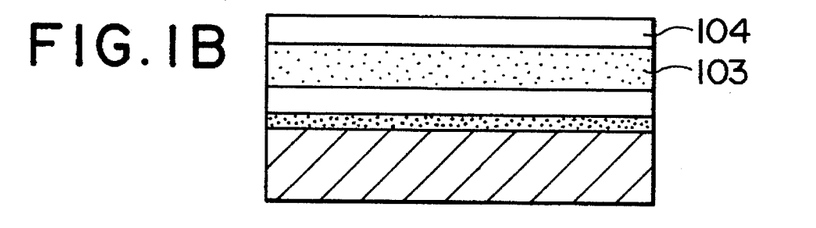
Figure 1C:
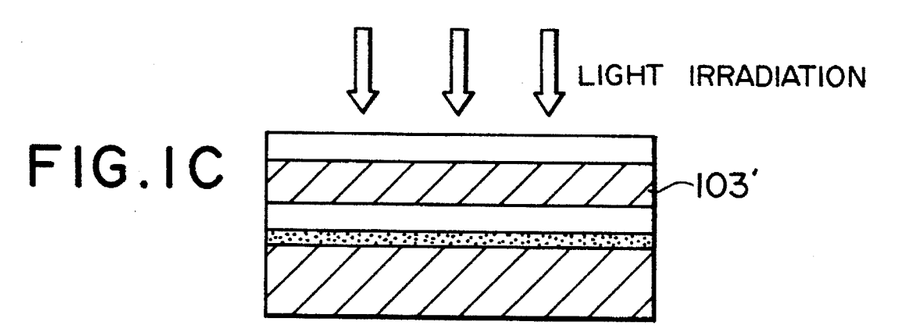
Figure 1D:
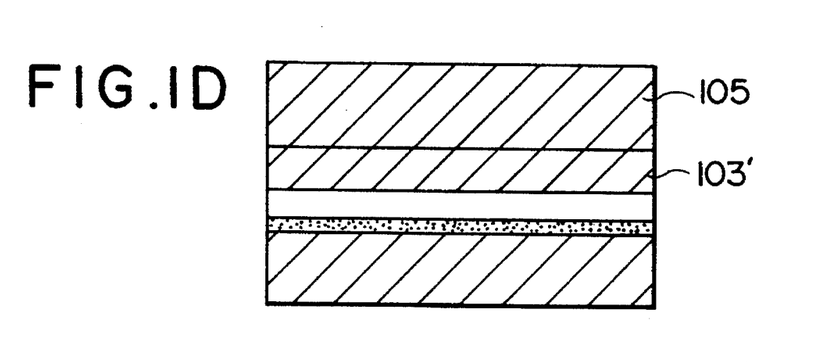

Major technical steps of the present invention include, as shown in FIG. 1A to FIG. 1D: (a) a second metal 106 and a metal oxide 102 are successively deposited on a substrate 101 made of a first metal by a thin-film forming technique such as vacuum vapor deposition or sputtering (FIG. 1A);

(b) thereafter, a silicon layer 103 is formed thereon by the CVD process or the like and a cap layer 104, for example of NSG (Non-doped Silicate Glass), is further deposited on the silicon layer 103 by the CVD process or the like (FIG. 1B); (c) subsequently, the silicon layer 103 is heated by lamp irradiation from above the cap layer 104 to effect fusion and recrystallization thereof so as to increase the crystal size (103') (FIG. 1C); (d) further, the cap layer 104 is removed and thereafter the thickness of the recrystallized silicon layer 103' is increased, for example, by a liquid phase growth method (105) (FIG. 1D).

Specifically, the above step (a) may use a ductile (or malleable) metal layer, for example copper (Cu), gold (Au), silver (Ag), or niobium (Nb), on the metal substrate, which can relieve strain due to a difference of thermal expansion coefficients between the metal substrate and the recrystallized silicon layer 103'. Further, using an electrically conductive metal oxide 102 such as ZnO, electric conduction can be established between the recrystallized silicon layer 103' and the metal substrate 101. In particular, ZnO can minimize the overall stress on the thin film, because the difference of thermal expansion coefficients from silicon is small. This arrangement can suppress film peeling and achieve good electric characteristics.

After repetitively conducting many experiments, the inventors have found that a large-crystal-size polycrystalline silicon layer was able to be formed by forming a ductile metal such as copper and a metal oxide such as ZnO on a metal substrate such as SUS and lamp-heating the silicon layer deposited thereon to effect fusion and recrystallization thereof, thus achieving the present invention. The experiments conducted by the inventors are described in detail in the following.

The experiments will be described in further detail with reference to the diagrammatic cross sections shown in FIG. 2A to FIG. 2E.

Experiment 1: Fusion and recrystallization of the silicon layer on the metal oxide.

Figure 2A:
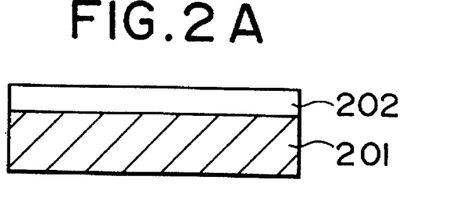
FIG. 2A to FIG. 2E are diagrammatic cross sections which illustrate another preferred example of production steps of a solar cell according to the present invention.
Figure 2B:
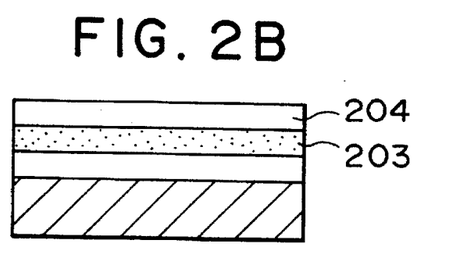
Figure 2C:
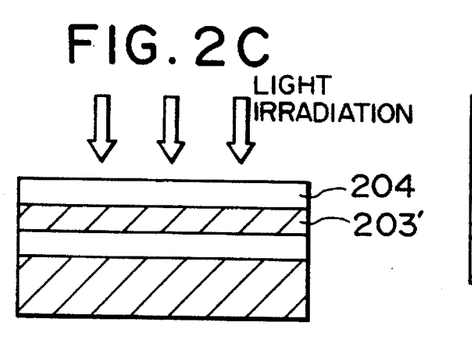
Figure 3:
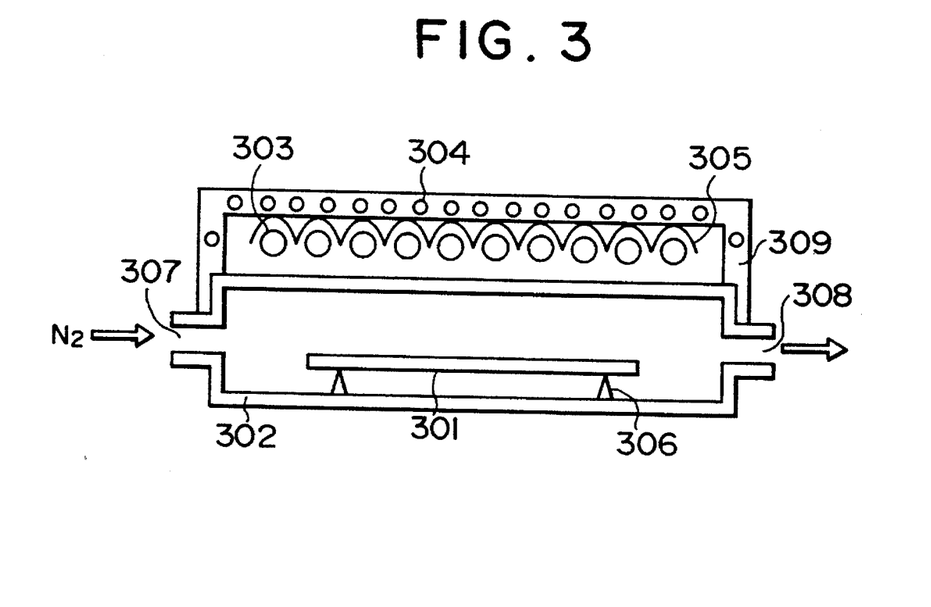
FIG. 3 is a diagrammatic structural view illustrating a preferred example of a lamp irradiating apparatus.
Figure 4:
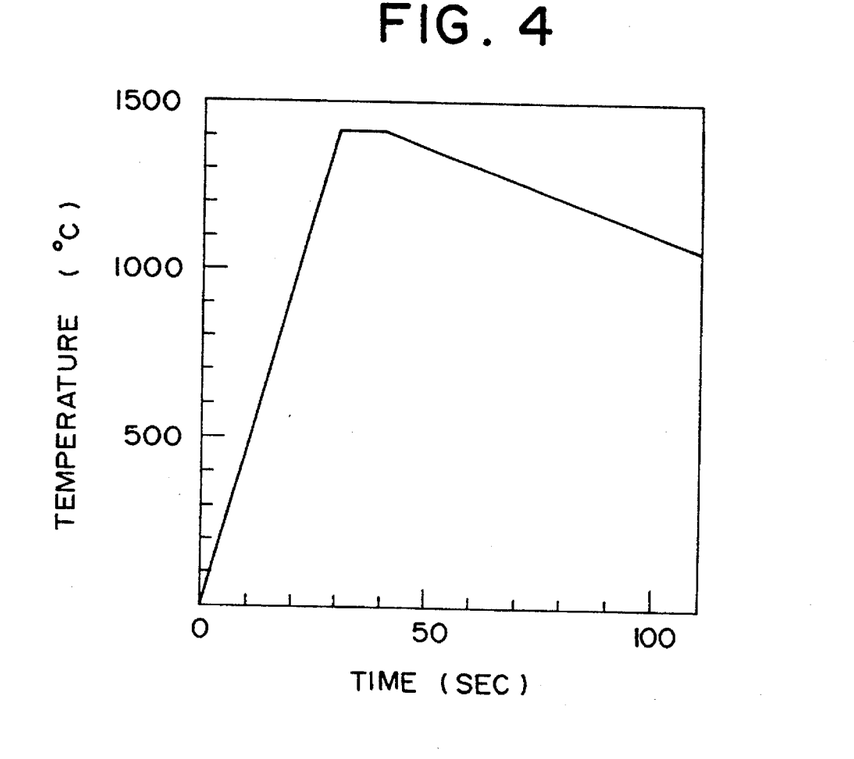
FIG. 4 is a graph showing a temperature sequence which illustrates a preferred example of heating.

As shown in FIG. 2A to FIG. 2E, a metal oxide layer 202 of ZnO was formed in a thickness of 2 μm on a surface of a metallurgical-grade silicon substrate 201 of 0.5 mm in thickness by a conventional sputtering method (FIG. 2A). On the metal oxide layer 202, a silicon layer 203 was deposited in a thickness of 6 μm by a conventional vacuum-vapor-deposition apparatus. It was confirmed by x-ray diffraction that the silicon layer 203 thus obtained was amorphous silicon. Over the silicon layer 203 formed on the metallurgical-grade silicon substrate 201, as obtained in the above step, an NSG film was deposited as a cap layer 204 in a thickness of 2 μm by an atmospheric pressure CVD apparatus (FIG. 2B). After that, the silicon layer 203 was irradiated with light from a halogen lamp from the side of the cap layer 204 to be fused and recrystallized (FIG. 2C). FIG. 3 is a schematic view of a lamp irradiating apparatus used in the irradiation, and FIG. 4 shows a temperature sequence of the fusion and recrystallization.

In FIG. 3, reference numeral 302 designates a silica chamber, and reference numeral 306 designates a support table for substrate 301.

As shown in FIG. 3, the chamber 302 is provided with an inlet port 307 for introducing a gas thereinto and an outlet port 308. The halogen lamps 303 are arranged as a heating means outside the chamber 302 in the upper part in the drawing, and the reflector 305 is arranged so that heat waves (light) from the halogen lamps 303 are effectively irradiated toward the substrate 301. On the opposite side of the reflector 305 to the halogen lamps 303, there is provided a cooling means having a cooling-water-pipe holding member 309 for holding the cooling water pipe 304 through which cooling water flows, thereby enabling cooling so as to avoid unnecessary heating of the reflector 305, etc.

After completion of the light irradiation, the NSG film on the recrystallized silicon layer was removed with hydrofluoric acid, and the surface and cross-sectional states of the recrystallized silicon layer 203' were observed using an optical microscope and a scanning electron microscope. The observation confirmed that a relatively flat silicon layer was obtained and the film thickness was approximately equal to that before fusion. Next, grain boundaries were revealed by Secco's etching, which showed that the grain sizes of the recrystallized silicon layer were increased to a maximum on the order of mm and that the etch pit density of the surface of the silicon layer was about $10^5$ pits/cm$^2$.

Figure 2D:
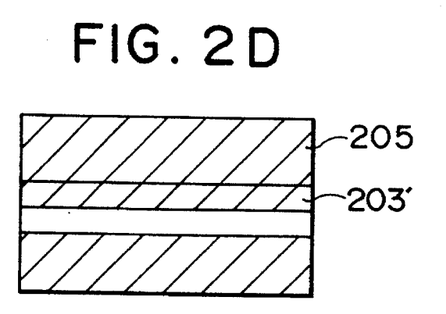

Next, a silicon layer 205 was further formed by the epitaxial growth method on the recrystallized silicon layer 203' above the SUS substrate 201, as obtained in Experiment 1 (FIG. 2D). The silicon layer 205 can be grown using a slide type liquid-phase growth apparatus and using Sn and Si as a solvent and a solute, respectively.

Here, the silicon layer 205 thus formed follows the crystallinity of the recrystallized silicon layer 203'.

Figure 2E:
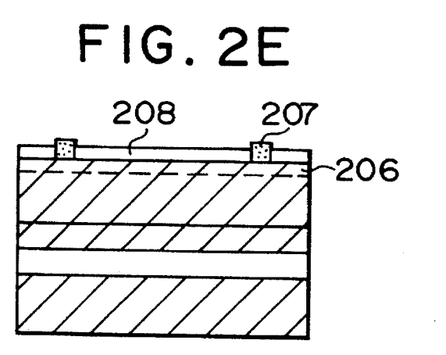

Subsequently, n$^+$ region 206 was formed by ion implantation of an atom belonging to Group V of the periodic table, and transparent electrode 208 and collector electrode 207 were pattern-formed on the n$^+$ region 206, thereby forming a solar cell (FIG. 2E).

Similarly as described above, a crystallized silicon layer was obtained when NiO was formed as the metal oxide layer 202 in a thickness of 2 μm on the surface of the metallurgical-grade silicon substrate 201 by a conventional sputtering method, the silicon layer 203 was deposited in a thickness of 6 μm on the metal oxide layer by a conventional vacuum vapor deposition apparatus, and the silicon layer was fused and recrystallized by lamp heating.

Experiment 2: Fusion and recrystallization of the silicon layer on the metal substrate/metal layer/metal oxide.

Fusion and recrystallization of a silicon layer on a SUS substrate was carried out in the same manner as in Experiment 1. Steps thereof are described using the diagrammatic cross sections shown in FIG. 5A to FIG. 5E.

Figure 5A:
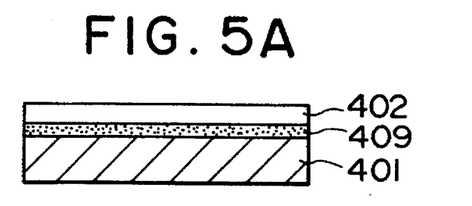
FIG. 5A to FIG. 5E are diagrammatic cross sections which illustrate another preferred example of production steps of a solar cell according to the present invention.
Figure 5B:
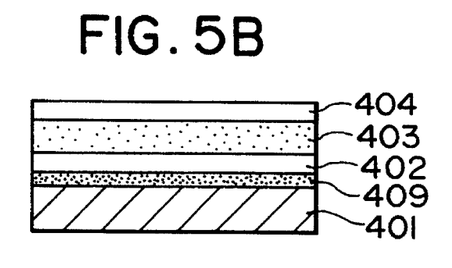

As shown in FIG. 5A to FIG. 5E, (a) Cu as a second metal layer 409 and ZnO as a metal oxide layer 402 were each formed by a conventional sputtering method in a thickness of 2 μm on a surface of a SUS substrate 401 of 0.8 mm in thickness (FIG. 5A); and (b) a silicon layer 403 was deposited in a thickness of 8 μm on the metal oxide layer 402 by a conventional vacuum vapor deposition apparatus. It was confirmed by x-ray diffraction that the silicon layer 403 thus formed was amorphous silicon. Over the silicon layer 403 on the SUS substrate 401, an NSG film was deposited as a cap layer 404 in a thickness of 2 μm by an atmospheric pressure CVD apparatus (FIG. 5B); (c) Then, light irradiation was conducted with a halogen lamp from the side of the cap layer 404 in accordance with the temperature sequence shown in FIG. 4 to fuse and recrystallize the silicon layer 403.

Figure 5C:
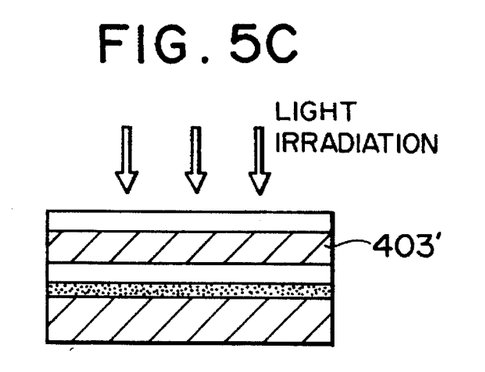

After completion of the light irradiation, the NSG film on the recrystallized silicon layer 403' was removed with hydrofluoric acid and the surface and cross-sectional states of the recrystallized silicon layer 403' were observed using an optical microscope and a scanning electron microscope. The observation showed that a relatively flat silicon layer was obtained and that the film thickness thereof was approximately equal to that before fusion. Secco's etching was performed to reveal grain boundaries, which showed that the grain sizes of the recrystallized silicon layer were increased to a maximum on the order of mm and the etch pit density of the surface of the silicon layer was about 105 pits/cm².

For comparison, the same experiment was conducted where deposition of the metal layer Cu was omitted in the above process. This comparative experiment confirmed that after fusion and recrystallization, bowing of the substrate and many slip lines in the silicon layer were observed. Thus the strain was relieved by interposition of the metal layer CU.

Experiment 3: Formation of thick silicon layer by the liquid phase growth method.

Figure 5D:
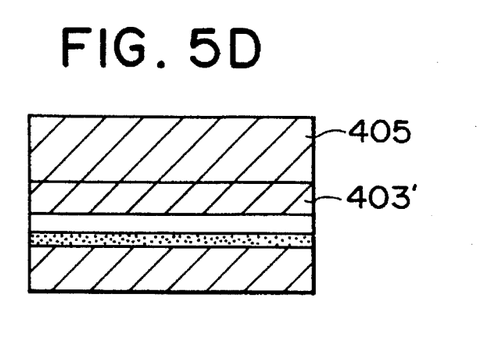

Next, as shown in FIG. 5D, a silicon layer 405 was formed using the liquid phase growth method on the recrystallized silicon layer 403=40 above the SUS substrate as obtained in Experiment 2. The formation of the silicon layer 405 was carried out using an ordinary slide type liquid phase growth apparatus and with Sn and Si as a solvent and a solute under conditions such that the growth start temperature was 950° C., the supercooling degree was 3° C., the temperature cooling rate was 0.5° C./min, and the growth time was 60 minutes.

After completion of the growth, the surface was observed using an optical microscope and a scanning electron microscope in the same manner as in Experiment 1, which ensured that a relatively flat silicon layer was obtained and that the film thickness thereof was about 50 μm. The silicon layer and a crystal size equivalent to the size of the ground recrystallized silicon layer 403' and the etch pit density of the surface of the grown silicon layer 405 was about $5 \times 10^4$ pits/cm².

Experiment 4: Production of solar cell.

Atoms (for example, phosphorus) belonging to Group V of the periodic table were ion-implanted in the surface of the large-crystal size silicon thin film on the SUS substrate as obtained in Experiment 3, and thereafter the resultant was annealed, thereby forming an n⁺ layer on the front surface side of the large-crystal size silicon thin film. Subsequently, collector electrode 407 and transparent electrode 408 were formed by the vacuum vapor deposition method or the sputtering method, and patterning was carried out, thereby forming a solar cell of the structure shown in FIG. 5E.

Figure 5E:
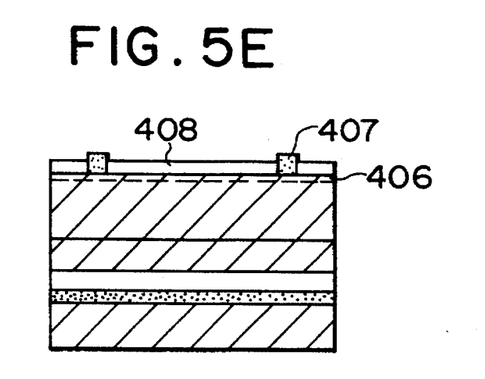

The collector electrode 407 may be made of any material with high electric conductivity, for example a metal, and is preferably made of a material that can make ohmic contact with the large-crystal size silicon of polycrystalline silicon thin film and/or the transparent electrode 408.

Also, the collector electrode 407 may be constructed in single-layer structure or in multi-layer structure of a combination of plural materials (for example, metals).

Specific examples of the metal oxide used in the solar cell of the present invention are those with a higher melting point than that of silicon and with electric conductivity, for example ZnO, NiO, V₂O₃, etc. Among them ZnO is preferred because it rarely causes stress, because of a small difference of thermal expansion coefficients from silicon and because thermal effects on the substrate can be relaxed thereby because of its low thermal conductivity. Although the thickness of the metal oxide layer depends upon the material of metal oxide, the conditions of fusion and recrystallization, etc., it is preferably in the range of approximately 0.01 μm to 10 μm and more preferably in the range of 0.1 μm to 1 μm. It is preferred that the thickness of the metal oxide be relatively thick for a thick silicon layer formed thereon and relatively thin for a thin silicon layer thereon.

Further, the silicon layer initially deposited on the metal oxide layer may be amorphous or crystalline, or a mixture of amorphous and crystalline silicon. The method for depositing the silicon layer may be any of the LPCVD method, the plasma CVD method, the vapor deposition method, the sputtering method, etc. The thickness of the silicon layer is preferably in the range of approximately 0.5 μm to 50 μm.

The cap layer on the silicon layer used in the method of the present invention may be selected from NSG, PSG (Phosphorus Silicate Glass), BSG (Boron Silicate Glass), Si₃N₄, etc., and combinations thereof, and can be formed by an atmospheric pressure CVD apparatus or an LPCVD apparatus, etc. In particular, using PSG or BSG, the conductivity type of the underlying silicon layer can be determined by diffusing an impurity therefrom into the silicon layer during fusion. Depending upon the material and the combination, the thickness of the cap layer is preferably in the range of 1 to 5 μm.

The layer of the second metal used in the solar cell of the present invention is a material with ductility or malleability, preferably Cu, Au, Ag, or Nb. Most preferred are Cu and Au with a relatively high melting point. There is no specific limitation on the layer thickness of the second metal layer, but a preferred range is between 0.01 μm and 10 μm, and a desired range is between 0.1 μm and 10 μm.

There is no specific limitation on the substrate of the first metal of the present invention, but use of SUS is preferred, on account of price, strength, processability, durability, and corrosion resistance.

Also, the crystal growth method used in the process for producing the thin-film polycrystalline silicon solar cell of the present invention may be any of the liquid phase growth method, the LPCVD method, the atmospheric pressure CVD method, the plasma CVD method, the photo assisted CVD method, the sputtering method, etc., but use of the liquid phase growth method is preferred from the aspects of growth rate and crystallinity. Depending upon the type of solvent, the range of growth temperature in the liquid phase growth method is desired to be controlled between 850° C. and 1050° C. (both inclusive) when Sn is utilized. Also, the supercooling degree is preferably about several °C., and the temperature cooling rate is preferably controlled in the range of 0.1 to 5° C./min.

Further, the final film thickness of the recrystallized silicon layer or the polycrystalline silicon layer obtained by the crystal growth method is preferably between 10 μm and 200 μm, as demanded by the characteristics of the solar cell, and more preferably, is between 20 μm and 200 μm.

An impurity is introduced for the purpose of forming a semiconductor junction in the surface of the obtained polycrystalline silicon layer, and the method for introducing the impurity may be the ion implantation method or the thermal diffusion method. The impurity is preferably selected from n-type impurities such as P, As, Sb, etc., and p-type impurities such as B, Al, Ga, etc. To form the semiconductor junction, a semiconductor layer of a different conductivity type from that of the polycrystalline silicon may be deposited on the surface of the polycrystalline silicon. Although depending upon the amount of the impurity introduced, junction depth or thickness of the semiconductor layer is preferably in the range of 0.01 μm to 1 μm, and more preferably is between 0.02 μm to 0.5 μm.

There is no specific limitation on the film thickness of the transparent conductive layer or the collector electrode so long as they exhibit the necessary functions. Thus, they can be properly designed within the ranges wherein the necessary power can be obtained.

Preferred examples of the transparent conductive film are indium oxide, tin oxide, a mixture thereof (ITO), and a thin film of aluminum or gold.

The substrate having a conductive surface may be not only a metal substrate but also a composite substrate in which a conductive material such as a metal is provided as a layer on an insulating substrate. However, a metal substrate is preferred in view of handling property, strength, price, etc.

EXAMPLES

The present invention will be described in more detail with specific examples thereof, but it should be noted that the present invention is not intended to be limited to these examples.

EXAMPLE 1

A large-crystal-grain-size polycrystalline silicon solar cell was produced on a metal substrate in the same manner as in Experiments 1 to 4 as described above.

On the surface of an SUS substrate 0.8 mm thick, Cu and ZnO were respectively formed as the second metal layer and the metal oxide layer each in a thickness of 2 μm by the sputtering method, and then an n-type silicon layer was deposited thereon in a thickness of 20 μm by the vacuum vapor deposition method. It was confirmed by x-ray diffraction that the silicon layer thus formed was amorphous.

Over the silicon layer thus formed above the SUS substrate, an NSG film was deposited as the cap layer in a thickness of 2 μm by the atmospheric pressure CVD method, and thereafter light irradiation was carried out from the cap layer side with a halogen lamp according to the temperature sequence shown in FIG. 4 to fuse and recrystallize the amorphous silicon layer.

After completion of the light irradiation, the NSG film on the recrystallized silicon layer was removed with an aqueous hydrofluoric acid (HF) solution, then boron (B) ions were ion-implanted into the surface of the silicon crystal thin film under the conditions of 20 keV and $1 \times 10^{15}/cm^2$, and the resultant was annealed at 800° C. for 30 minutes to form a $p^+$ layer 406. Further, the collector electrodes (Ti/Pd/Ag (0.04 μm/0.02 μm/1 μm)) and ITO transparent conductive film were formed on the $p^+$ layer by EB (Electron Beam) evaporation.

For the thus produced solar cell having the large-crystal-grain-size Si thin film/ZnO/Cu/SUS structure, the I–V characteristics were measured under AM 1.5 light irradiation (100 mW/cm$^2$), which showed an open-circuit voltage of 0.54 V, a short-circuit photocurrent of 26 mA/cm$^2$, and a fill factor of 0.72 for a cell area of 2 cm$^2$, thus obtaining a conversion efficiency of 10.1%.

EXAMPLE 2

An $n^+$/p-type polycrystalline silicon crystal solar cell was produced in the same manner as in Example 1. The production process therefor is shown in FIG. 5A to FIG. 5E.

On the surface of an SUS substrate 401 of 0.8 mm thickness, Cu and ZnO were respectively formed as the second metal layer 409 and the metal oxide layer 402 each in a thickness of 2 μm by conventional sputtering, and then the silicon layer 403 was deposited thereon in a thickness of 10 μm by conventional LPCVD. It was confirmed by x-ray diffraction that the thus formed silicon layer was polycrystalline with crystal grain sizes of about 8 nm.

On the silicon layer thus formed on the SUS substrate, a BSG film was deposited in a thickness of 2 μm by the atmospheric pressure CVD method as the cap layer 404 and also to determine the conductivity type of the silicon layer 403, and then the light irradiation was carried out with the halogen lamp in accordance with the temperature sequence shown in FIG. 4 to fuse and recrystallize the silicon layer.

After removing the BSG layer with an aqueous HF solution, crystal growth was effected under the following conditions by a liquid phase growth apparatus, using a conventional slide type boat method and a solvent of Sn, to obtain a large-crystal-size silicon crystal thin film 405. In detail, the growth was carried out in a hydrogen atmosphere, at a growth starting temperature of 950° C., a supercooling degree of 3° C., a temperature cooling rate of 0.5° C./min, and a growth time of 55 minutes. The final total thickness of the silicon crystal thin film and the recrystallized silicon layer thus formed was about 50 μm.

Next, thermal diffusion of P was effected on the surface of the silicon crystal layer with a diffusion source of POCl$_3$ and at a temperature of 900° C. to form the $n^+$ layer 406, thereby obtaining a junction depth of about 0.5 μm. A dead layer in the surface of the $n^+$ layer thus formed was removed by etching to obtain a junction depth of about 0.2 μm with moderate surface dopant concentration. Further, the collector electrode 407 and ITO transparent conductive film 408 were formed on the $n^+$ layer in the same manner as in Example 1.

For the thus produced solar cell having the $n^+$-Si/p-Si polycrystalline thin film/ZnO/Cu/SUS structure, the I–V characteristics were measured under AM 1.5 light irradiation (100 mW/cm$^2$), which showed an open-circuit voltage of 0.55 V, a short-circuit photocurrent of 33 mA/cm$^2$, and a fill factor of 0.72 for a cell area of 2 cm$^2$, thus obtaining a conversion efficiency of 13.1%.

EXAMPLE 3

A solar cell of a $p^+$ μc-Si/polycrystalline Si heterojunction type was produced in the same manner as in Examples 1 and 2.

Cu was deposited in a thickness of 3 μm on an SUS substrate by vapor deposition, then ZnO was deposited in a thickness of 2 μm on the Cu layer by sputtering, and a silicon layer was further deposited in a thickness of 12 μm on the ZnO layer by the LPCVD method.

A PSG film was deposited in a thickness of 2 μm on the silicon layer by the atmospheric pressure CVD method as a cap layer and also for determining the conductivity type of the silicon layer, and then light irradiation was carried out with the halogen lamp in accordance with the temperature sequence shown in FIG. 4 to fuse and recrystallize the silicon layer.

After removing the PSG layer with an aqueous HF solution, silicon growth was effected by a liquid phase growth apparatus using a conventional slide type boat method with a solvent of Sn and a solute of Si in a hydrogen atmosphere, at a growth starting temperature of 950° C., a supercooling degree of 3° C., a temperature cooling rate of 0.5° C./min, and for a growth time of 55 minutes. The final thickness of the thus obtained silicon crystal thin film was about 50 μm.

FIG. 6A to FIG. 6E show the process for producing the heterojunction type solar cell. Here, members in FIGS. 6A to 6E with same reference numerals as those in FIGS. 5A to 5E represent the same members as those in FIGS. 5A to 5E.

Figure 6A:
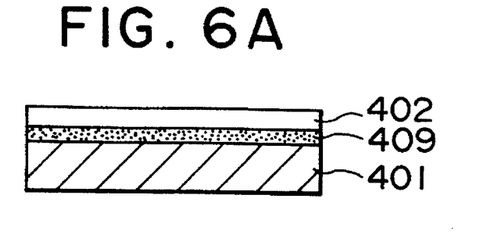
FIG. 6A to FIG. 6E are diagrammatic cross sections which illustrate another preferred example of production steps of a solar cell according to the present invention.
Figure 6B:
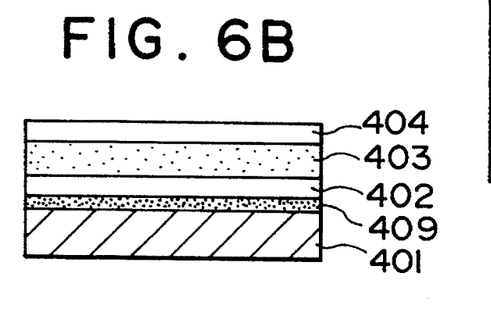
Figure 6C:
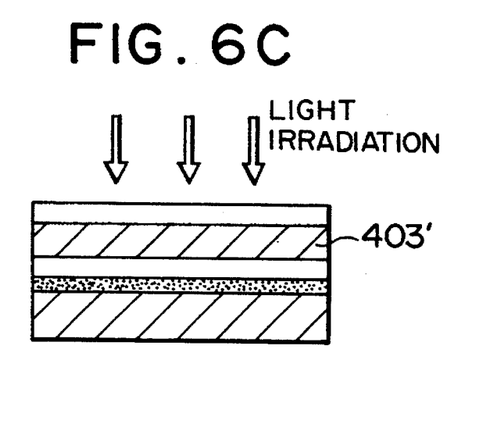
Figure 6D:
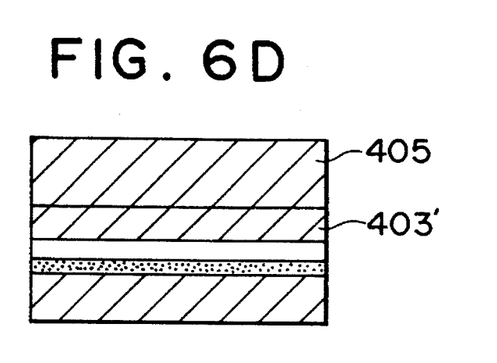
Figure 6E:
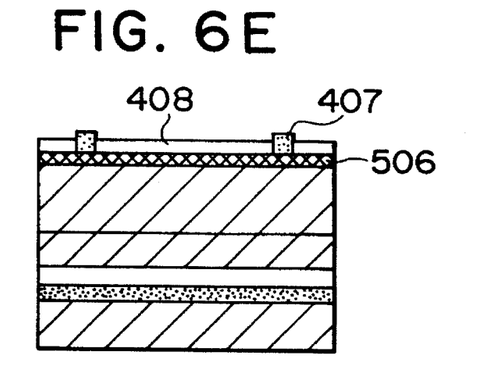

The process of this example is similar to that in the case of FIGS. 5A to 5E showing Example 2, but in the present example a p-type microcrystalline silicon (μc-Si; crystal grain size: 30 Å to 500 Å) semiconductor layer 506 is formed on the silicon crystal layer in FIG. 6E instead of producing the $n^+$ layer 406.

The p-type μc-Si layer 506 was deposited in a thickness of 0.02 μm on the silicon crystal surface under the conditions as listed in Table 1, using a conventional plasma CVD apparatus. The dark conductivity of the μc-Si film in this case was about 10 S/cm.

TABLE 1

| Ratio of gas flow rates | Temperature of Substrate | Pressure | Discharge power |
|---|---|---|---|
| $SiH_4/H_2$ = 1 cc/20 cc $B_2H_6/SiH_4$ = $2 \times 10^{-3}$ | 250° C. | 0.5 Torr | 20 W |

Further, ITO was formed as the transparent conductive film 408 in a thickness of about 0.1 μm by electron beam evaporation, and the collector electrode 407 (Cr (0.02 μm)/Ag (1 μm)/Cr (0.00.4 μm)) was formed thereon by vacuum vapor deposition.

For the $p^+$ μc-Si/polycrystalline Si heterojunction type solar cell thus obtained, the I–V characteristics were measure under AM 1.5 light irradiation, which showed an open-circuit voltage of 0.60 V, a short-circuit photocurrent of 34.8 mA/cm$^2$, and a fill factor of 0.67 for a cell area of 1.6 cm$^2$, thus obtaining a high value of conversion efficiency of 14.0%.

EXAMPLE 4

A large-crystal-grain-size silicon solar cell was produced by the process as shown in FIGS. 5A to 5E in the same manner as in Example 1.

As described previously, Cu and ZnO were each deposited in a thickness of 3 μm on a 0.4 mm thick SUS substrate by sputtering, and an n-type silicon layer was then deposited in a thickness of 40 μm on the surface of the ZnO layer by the atmospheric pressure CVD method. Next, an NSG film was deposited as the cap layer in a thickness of 2 μm by the atmospheric pressure CVD method, and thereafter light irradiation was carried out with the halogen lamp in accordance with the temperature sequence shown in FIG. 4 to fuse and recrystallize the silicon layer.

After completion of the light irradiation, the NSG film on the recrystallized silicon layer was removed with an aqueous HF solution, and in order to form a p layer in the surface of the silicon crystal thin film, BSG was deposited by atmospheric pressure CVD apparatus and a RTA (Rapid Thermal Annealing) treatment was carried out. The thickness of the deposited BSG was about 0.6 μm and the RTA treatment was conducted at 1050° C. for 60 seconds. The junction depth at this time was about 0.2 μm.

After removing the BSG layer with an aqueous HF solution, the surface of the silicon crystal layer was further thinly oxidized by dry oxidation (about 0.01 μm), the oxide film was etched in a fine grid pattern using the photolithography process, and then the collector electrode (Ti/Pd/Ag (0.04 μm/0.02 μm/1 μm))/transparent conductive film ITO (0.085 μm) were formed on the $p^+$ layer by EB evaporation using a metal mask.

For the thus produced thin film crystal solar cell, the I–V characteristics were checked under AM 1.5 light irradiation, which showed an open-circuit voltage of 0.56 V, a short-circuit photocurrent of 31 mA/cm$^2$, and a fill factor of 0.71 for cell area of 2.5 cm$^2$, thus obtaining a conversion efficiency of 12.3%.

EXAMPLE 5

A solar cell of the structure shown in FIG. 5E was produced using the SUS substrate obtained in Experiment 3. P (phosphorus) was ion-implanted under the conditions of 80 keV and $1\times10^{15}$/cm$^2$ in the surface of the large-crystal-grain-size silicon thin film formed on the SUS substrate obtained in Experiment 3, and the resultant was annealed at 800° C. for 30 minutes no form the $n^+$ layer 406. Subsequently, the multi-layer collector electrode 407 [Cr (0.02 μm)/Ag (1 μm)/Cr (0.04 μm) formed in order from the bottom] and transparent electrode (ITO (0.085 μm)) 408 were formed thereon by vacuum vapor deposition.

For the solar cell having the large-crystal-grain-size Si crystal thin film/ZnO/Cu/SUS structure thus produced, the I–V characteristics were measured under AM 1.5 light irradiation (100 mW/cm$^2$), which showed an open-circuit voltage of 0.53 V, a short-circuit photocurrent of 31 mA/cm$^2$, and a fill factor of 0.73 for a cell area of 2 cm$^2$, thus obtaining a conversion efficiency of 12.0%.

As described, it was confirmed that a large-crystal-grain-size silicon thin film could be formed by depositing a second metal layer, a metal oxide layer, and a silicon layer on a first metal substrate, and fusing and recrystallizing the silicon layer by radiant heating, whereby solar cells with excellent characteristics could be formed.

As detailed above, according to the present invention, thin-film polycrystalline solar cells with excellent characteristics can be formed on a metal substrate in simple steps. This enables manufacture of cheap and good quality thin-film solar cells with mass producibility.

Also, the present invention can provide solar cells having polycrystalline silicon layers of large crystal grain size and good characteristics, and a production process therefor.

Further, according to the present invention, the large-crystal-grain-size polycrystalline silicon semiconductor layer can be grown on a metal substrate which is a low-cost substrate, whereby cheaper solar cells can be produced by a simpler method.

In addition, the present invention can provide a production process of solar cells which can provide high-quality polycrystalline silicon layers with little stress.

It is noted that the present invention is by no means limited to the above examples but may include various changes and modifications within the scope of the essence of the present invention.

What is claimed is:

1. A solar cell comprising a layer of a first metal, a layer of a conductive metal oxide, and a polycrystalline semiconductor layer successively formed on a substrate of a second metal.

2. A solar cell according to claim 1, wherein said first metal layer has a thickness of 0.01 to 10 μm.

3. A solar cell comprising a layer of a metal, a layer of a conductive metal oxide, and a polycrystalline semiconductor layer successively formed on a substrate, wherein said metal layer comprises a metal selected from copper, gold, silver, and niobium.

4. A solar cell comprising a layer of a metal, a layer of a conductive metal oxide, and a polycrystalline semiconductor layer successively formed on a substrate, wherein said conductive metal oxide layer comprises an oxide selected from zinc oxide, nickel oxide, and vanadium oxide.

5. A solar cell comprising a layer of a metal, a layer of a conductive metal oxide, and a polycrystalline semiconductor layer successively formed on a substrate, wherein said metal layer is of a metal having ductility or malleability.

6. A solar cell according to claim 1, 3, 4, or 5, further comprising a transparent electrode on said polycrystalline semiconductor layer.

7. A solar cell according to claim 1, 3, 4, or 5, further comprising a collector electrode on said polycrystalline semiconductor layer.

8. A solar cell according to claim 1, 3, 4, or 6, wherein said substrate has a conductive surface.

9. A solar cell according to claim 3, 4, or 6, wherein said substrate is a metal.

10. A solar cell according to claim 1, 3, 4, or 5, wherein said conductive metal oxide layer has a thickness of 0.01 to 10 μm.

11. A solar cell according to claim 1, 3, 4, or 5, wherein said polycrystalline semiconductor layer comprises polycrystalline silicon.

12. A solar cell according to claim 1, 3, 4, or 5, further comprising a microcrystalline semiconductor layer on said polycrystalline semiconductor layer.

13. A solar cell according to claim 12, wherein said microcrystalline semiconductor layer comprises microcrystalline silicon having crystal sizes of 30 Å to 500 Å.

14. A solar cell according to claim 3, 4, or 5, wherein said metal layer has a thickness of 0.01 to 10 μm.

15. A solar cell according to claim 3, 4, or 5, wherein said conductive metal oxide layer comprises an oxide selected from zinc oxide, nickel oxide, and vanadium oxide.

16. A solar cell according to claim 3 or 4, wherein said metal layer is of a metal having ductility or malleability.

17. A process for producing a solar cell, comprising:
   (i) a step of depositing a layer of a first metal on a substrate of a second metal;
   (ii) a step of depositing a layer of a conductive metal oxide on the first metal layer;
   (iii) a step of depositing a semiconductor layer on the conductive metal oxide layer;
   (iv) a step of depositing a cap layer on the surface of the semiconductor layer and fusing and solidifying the semiconductor layer by radiant heating from above the cap layer to form a polycrystalline semiconductor layer, wherein the radiant heating is effected with light radiated from a lamp; and
   (v) a step of removing the cap layer.

18. A process for producing a solar cell according to claim 17, wherein the first metal layer has a thickness of 0.01 to 10 μm.

19. A process for producing a solar cell, comprising:
   (i) a step of depositing a layer of a metal on a substrate;
   (ii) a step of depositing a layer of a conductive metal oxide on the metal layer;
   (iii) a step of depositing a semiconductor layer on the conductive metal oxide layer;
   (iv) a step of depositing a cap Layer on the surface of the semiconductor layer and fusing and solidifying the semiconductor layer by radiant heating from above the cap layer to form a polycrystalline semiconductor layer; and
   (v) a step of removing the cap layer, wherein the metal layer comprises a metal selected from copper, gold, silver, and niobium.

20. A process for producing a solar cell, comprising:
   (i) a step of depositing a layer of a metal on a substrate;
   (ii) a step of depositing a layer of a conductive metal oxide on the metal layer;
   (iii) a step of depositing a semiconductor layer on the conductive metal oxide layer;
   (iv) a step of depositing a cap layer on the surface of the semiconductor layer and fusing and solidifying the semiconductor layer by radiant heating from above the cap layer to form a polycrystalline semiconductor layer; and
   (v) a step of removing the cap layer, wherein the conductive metal oxide layer comprises an oxide selected from zinc oxide, nickel oxide, and vanadium oxide.

21. A process for producing a solar cell, comprising:
   (i) a step of depositing a layer of a metal on a substrate;
   (ii) a step of depositing a layer of a conductive metal oxide on the metal layer;
   (iii) a step of depositing a semiconductor layer on the conductive metal oxide layer;
   (iv) a step of depositing a cap layer on the surface of the semiconductor layer and fusing and solidifying the semiconductor layer by radiant heating from above the cap layer to form a polycrystalline semiconductor layer; and
   (v) a step of removing the cap layer, wherein the metal layer is of a metal having ductility or malleability.

22. A process for producing a solar cell according to claim 17, 19, 20, or 21, further comprising, after said step (v), a step of forming a semiconductor junction in the surface of the polycrystalline semiconductor layer.

23. A process for producing a solar cell according to claim 22, wherein the semiconductor junction is formed by ion implantation into the surface of the semiconductor layer.

24. A process for producing a solar cell according to claim 22, wherein the semiconductor junction is formed by deposition of a further semiconductor layer.

25. A process for producing a solar cell according to claim 24, wherein the further semiconductor layer comprises a microcrystalline semiconductor.

26. A process for producing a solar cell according to claim 17, 19, 20, or 21, further comprising, after said step (v), a step of increasing the thickness of the polycrystalline semiconductor layer.

27. A process for producing a solar cell according to claim 26, wherein said step of increasing the thickness utilizes a crystal growth method.

28. A process for producing a solar cell according to claim 27, wherein said crystal growth method is liquid phase growth.

29. A process for producing a solar cell according to claim 28, wherein said liquid phase growth is performed using a solvent of Sn and a solute of Si.

30. A process for producing a solar cell according to claim 26, further comprising a step of forming a semiconductor junction in the surface of the increased thickness polycrystalline semiconductor.

31. A process for producing a solar cell according to claim 30, wherein the semiconductor junction is formed by ion implantation into the surface of the semiconductor layer.

32. A process for producing a solar cell according to claim 30, wherein the semiconductor junction is formed by deposition of a further semiconductor layer.

33. A process for producing a solar cell according to claim 32, wherein the further semiconductor layer comprises a microcrystalline semiconductor.

34. A process for producing a solar cell according to claim 26, wherein a transparent electrode is provided on the polycrystalline semiconductor layer.

35. A process for producing a solar cell according to claim 26, wherein a collector electrode is provided on the polycrystalline semiconductor layer.

36. A process for producing a solar cell according to claim 26, wherein the polycrystalline semiconductor layer comprises polycrystalline silicon.

37. A process for producing a solar cell according to claim 17, 19, 20, or 21, further comprising, after said step (v), a step of forming a transparent electrode on the polycrystalline semiconductor layer.

38. A process for producing a solar cell according to claim 17, 19, 20, or 21, further comprising, after said step (v), a step of forming a collector electrode on the polycrystalline semiconductor layer.

39. A process for producing a solar cell according to claim 17, 19, 20, or 21, wherein the substrate has a conductive surface.

40. A process for producing a solar cell according to claim 19, 20, or 21, wherein the substrate is a metal.

41. A process for producing a solar cell according to claim 17, 19, 20, or 21, wherein the conductive metal oxide layer has a thickness of 0.01 to 10 µm.

42. A process for producing a solar cell according to claim 17, 19, 20, or 21, wherein the polycrystalline semiconductor layer comprises polycrystalline silicon.

43. A process for producing a solar cell according to claim 17, 19, 20, or 21, wherein the semiconductor layer is an amorphous semiconductor layer.

44. A process for producing a solar cell according to claim 43, wherein the amorphous semiconductor layer comprises amorphous silicon.

45. A process for producing a solar cell according to claim 17, 19, 20, or 21, wherein the cap layer comprises a material selected from the group consisting of NSG, PSG, BSG, and $Si_3N_4$.

46. A process for producing a solar cell according to claim 17, 19, 20, or 21, wherein the cap layer has a thickness of 1 to 5 µm.

47. A process for producing a solar cell according to claim 19 or 21, wherein the conductive metal oxide layer comprises an oxide selected from zinc oxide, nickel oxide, and vanadium oxide.

48. A process for producing a solar cell according to claim 19 or 20, wherein the metal layer is of a metal having ductility or malleability.

49. A process for producing a solar cell according to claim 19, 20, or 21, wherein the metal layer has a thickness of 0.01 to 10 µm.

* * * * *

UNITED STATES PATENT AND TRADEMARK OFFICE
CERTIFICATE OF CORRECTION

PATENT NO. : 5,584,941

DATED : December 17, 1996

INVENTOR : SHOJI NISHIDA

It is certified that error appears in the above-identified patent and that said Letters Patent is hereby corrected as shown below:

COLUMN 3

Line 25, "inventors have" should read --inventor has--;
Line 31, "inventors" should read --inventor--.

COLUMN 5

Line 3, "105" should red --$10^5$--;
Line 16, "layer 403=40" should read --layer 403'--;
Line 30, "and" should read --had--.

COLUMN 6

Line 34, "photo assisted" should read --photo-assisted--.

COLUMN 9

Line 29, "sure" should read --sured--.

COLUMN 10

Line 15, "no" should read --to--.

UNITED STATES PATENT AND TRADEMARK OFFICE
CERTIFICATE OF CORRECTION

PATENT NO. : 5,584,941

DATED : December 17, 1996

INVENTOR : SHOJI NISHIDA

It is certified that error appears in the above-identified patent and that said Letters Patent is hereby corrected as shown below:

COLUMN 11

Line 14,   "6," should read --5,--;
    Line 16,   "6," should read --5,--;
    Line 31,   "claim 3," should read --claim 3--;
    Line 59,   "Layer" should read --layer--.

Signed and Sealed this

Nineteenth Day of August, 1997

Attest:

BRUCE LEHMAN

Attesting Officer      Commissioner of Patents and Trademarks